(12) United States Patent
Yamane

(10) Patent No.: US 12,074,178 B2
(45) Date of Patent: Aug. 27, 2024

(54) IMAGING DEVICE AND ELECTRONIC APPARATUS

(71) Applicant: SONY SEMICONDUCTOR SOLUTIONS CORPORATION, Kanagawa (JP)

(72) Inventor: Chigusa Yamane, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 474 days.

(21) Appl. No.: 17/309,790

(22) PCT Filed: Nov. 22, 2019

(86) PCT No.: PCT/JP2019/045725
§ 371 (c)(1),
(2) Date: Jun. 18, 2021

(87) PCT Pub. No.: WO2020/137282
PCT Pub. Date: Jul. 2, 2020

(65) Prior Publication Data
US 2022/0109017 A1    Apr. 7, 2022

(30) Foreign Application Priority Data

Dec. 28, 2018 (JP) ................................. 2018-247892

(51) Int. Cl.
*H01L 27/146* (2006.01)
(52) U.S. Cl.
CPC .. *H01L 27/14605* (2013.01); *H01L 27/14607* (2013.01); *H01L 27/14621* (2013.01)

(58) Field of Classification Search
CPC .............................................. H01L 31/022475
See application file for complete search history.

(56) References Cited

U.S. PATENT DOCUMENTS

| 2009/0251653 A1 | 10/2009 | Hayashi |
| 2013/0015547 A1 | 1/2013 | Hamano |
| 2018/0219039 A1* | 8/2018 | Uchida ............. H01L 27/14694 |
| 2019/0081191 A1 | 3/2019 | Manda et al. |
| 2019/0252437 A1 | 8/2019 | Uchida et al. |

FOREIGN PATENT DOCUMENTS

| CN | 107851650 A | 3/2018 |
| CN | 108701706 A | 10/2018 |
| EP | 3432357 A1 | 1/2019 |

(Continued)

OTHER PUBLICATIONS

International Search Report and Written Opinion of PCT Application No. PCT/JP2019/045725, issued on Feb. 18, 2020, 10 pages of ISRWO.

*Primary Examiner* — Yu-Hsi D Sun
(74) *Attorney, Agent, or Firm* — CHIP LAW GROUP

(57) ABSTRACT

An imaging device according to one embodiment of the present disclosure includes a first electrode, a second electrode, and a photoelectric converter. The first electrode includes an oxide semiconductor material having an amorphous state. The second electrode is opposed to the first electrode. The photoelectric converter is provided between the first electrode and the second electrode, and includes a compound semiconductor material.

11 Claims, 16 Drawing Sheets

(56) References Cited

FOREIGN PATENT DOCUMENTS

| | | |
|---|---|---|
| JP | 2009-251174 A | 10/2009 |
| JP | 2011-228630 A | 11/2011 |
| JP | 2017-028078 A | 2/2017 |
| JP | 2017-157816 A | 9/2017 |
| JP | 2017-175102 A | 9/2017 |
| KR | 10-2013-0038208 A | 4/2013 |
| WO | 2011/125527 A1 | 10/2011 |
| WO | 2017/013924 A1 | 1/2017 |
| WO | 2017/159130 A1 | 9/2017 |

\* cited by examiner

[FIG. 1]
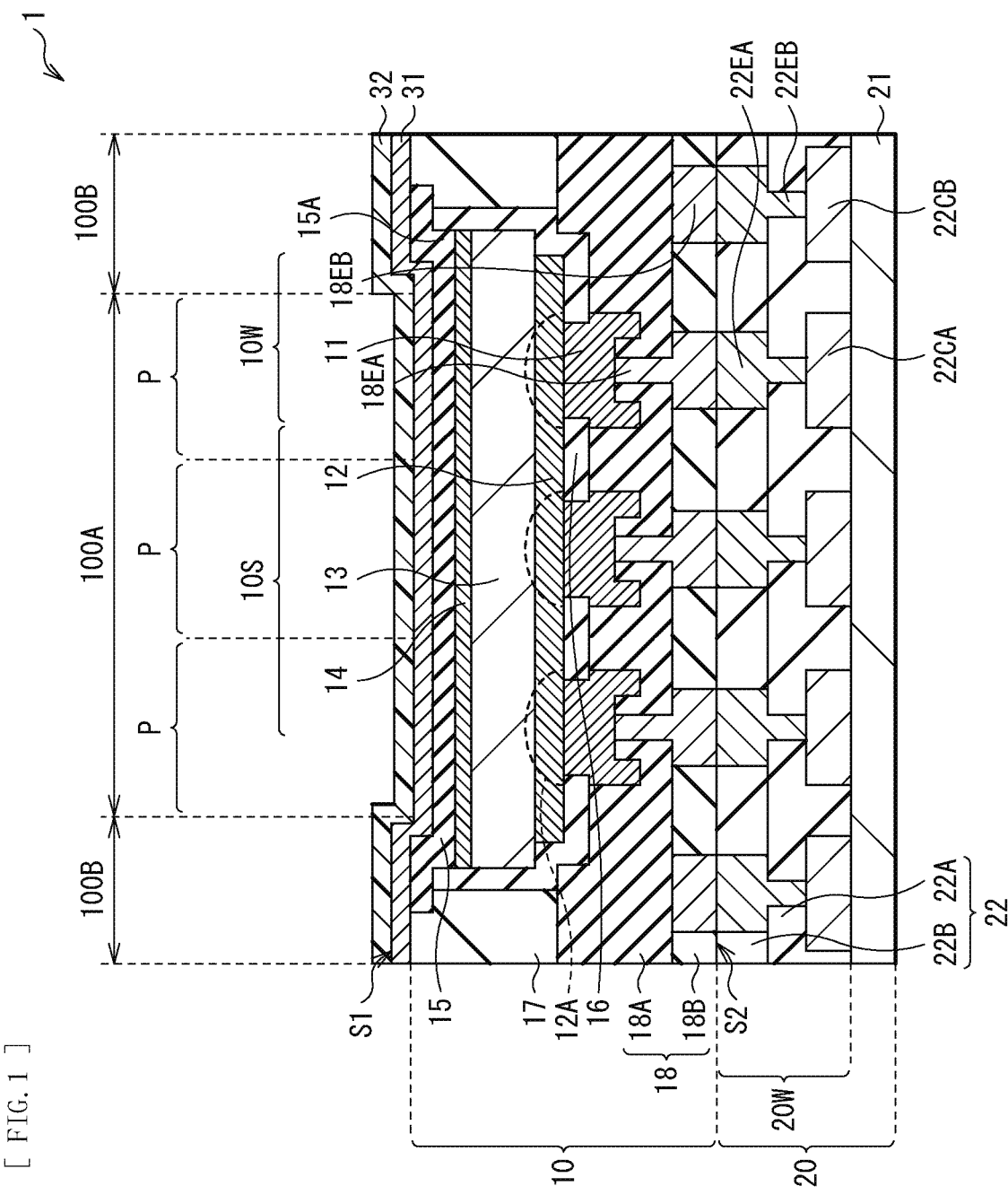

[ FIG. 2 ]
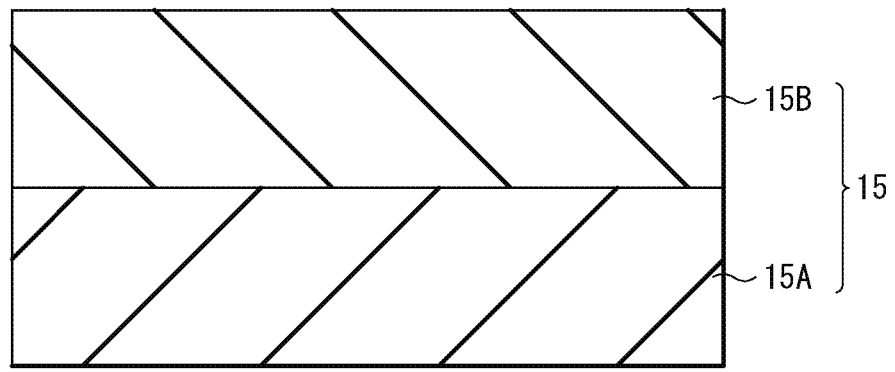

[ FIG. 3A ]
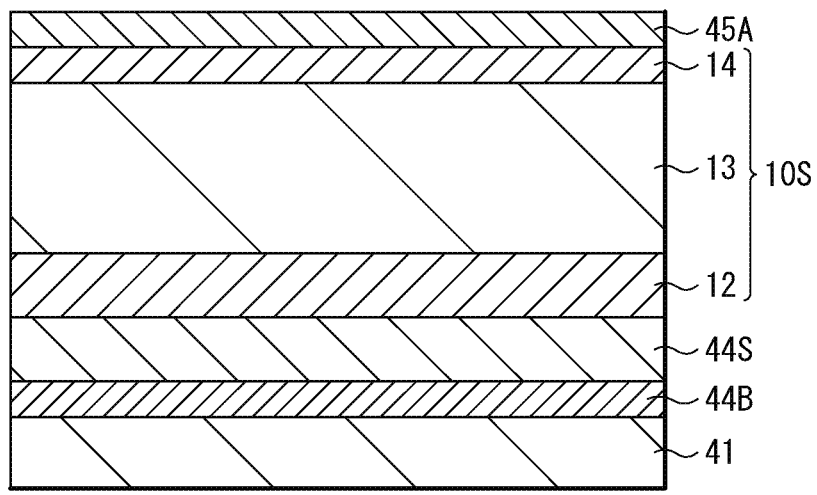
[ FIG. 3B ]
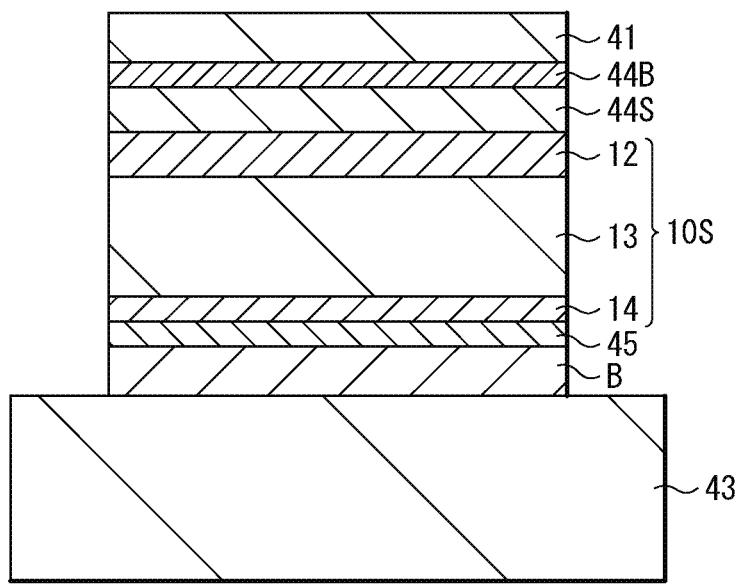

[ FIG. 4A ]
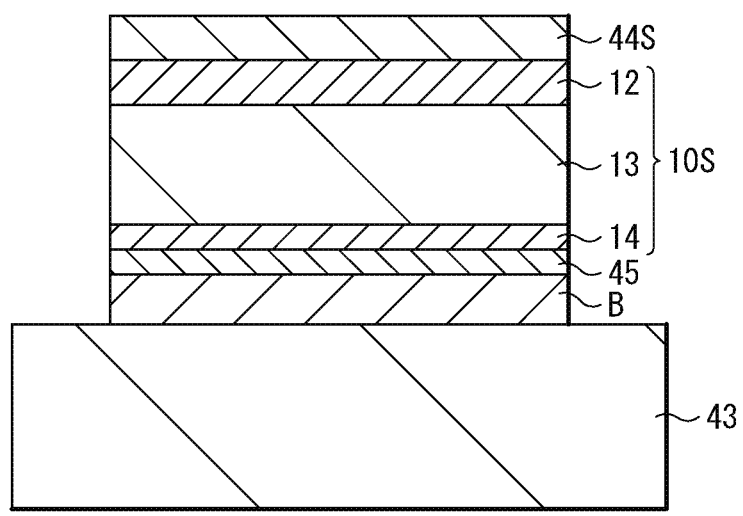
[ FIG. 4B ]
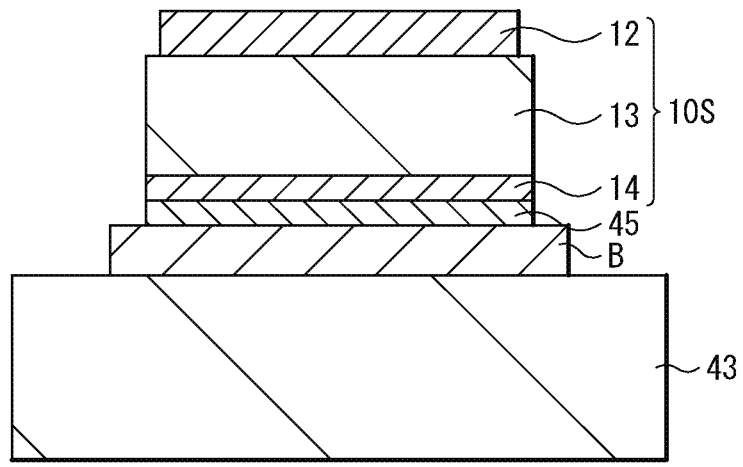

[ FIG. 5A ]
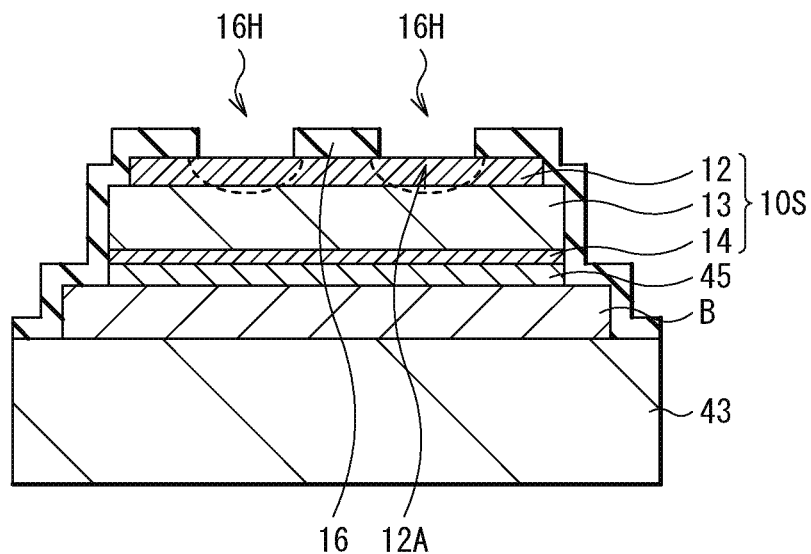
[ FIG. 5B ]
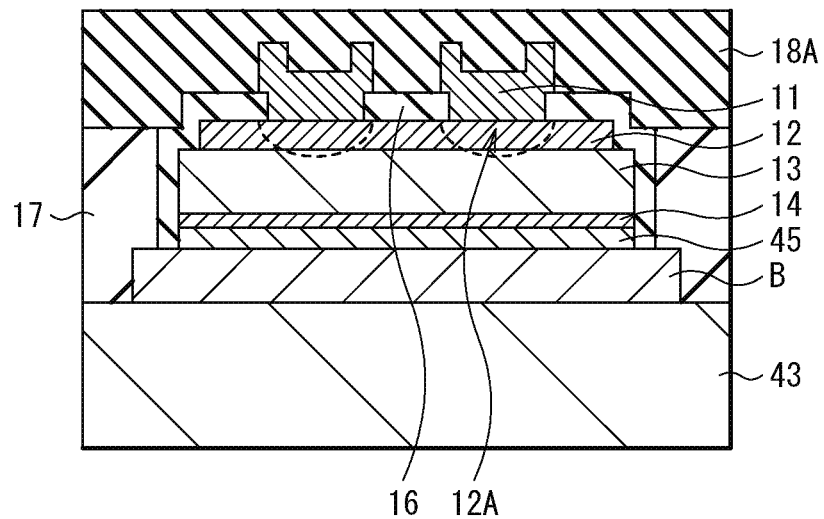

[FIG. 6A]
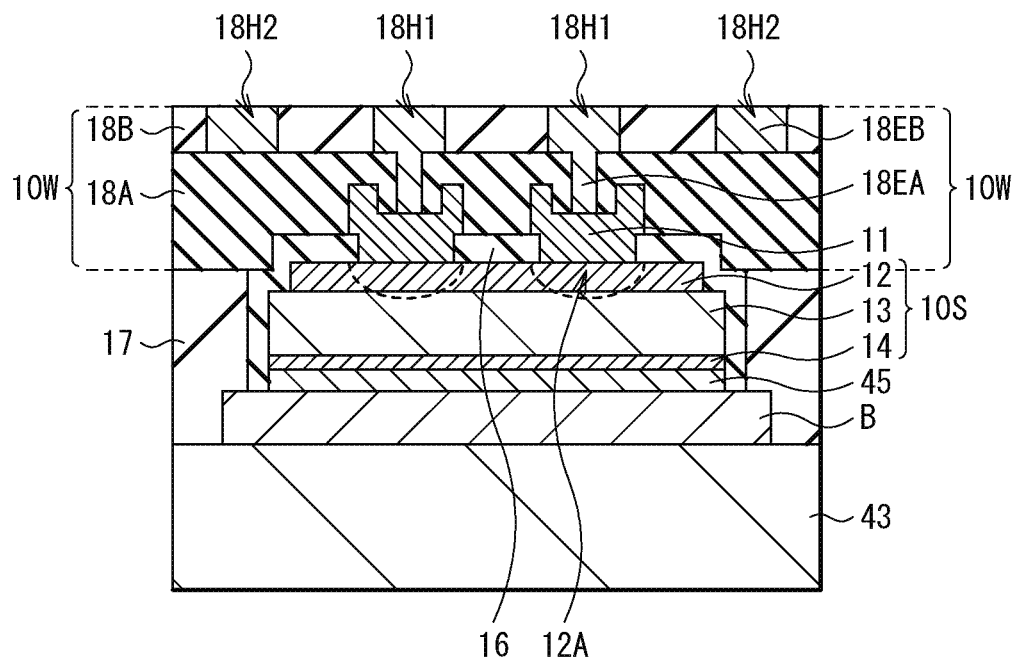
[FIG. 6B]
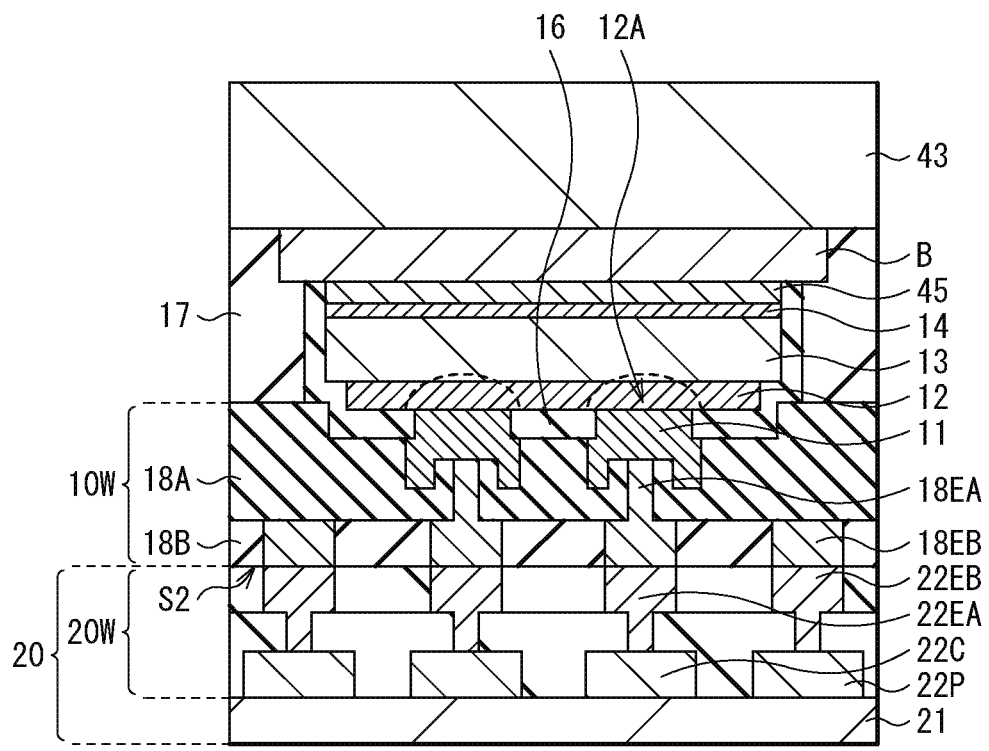

[ FIG. 7A ]
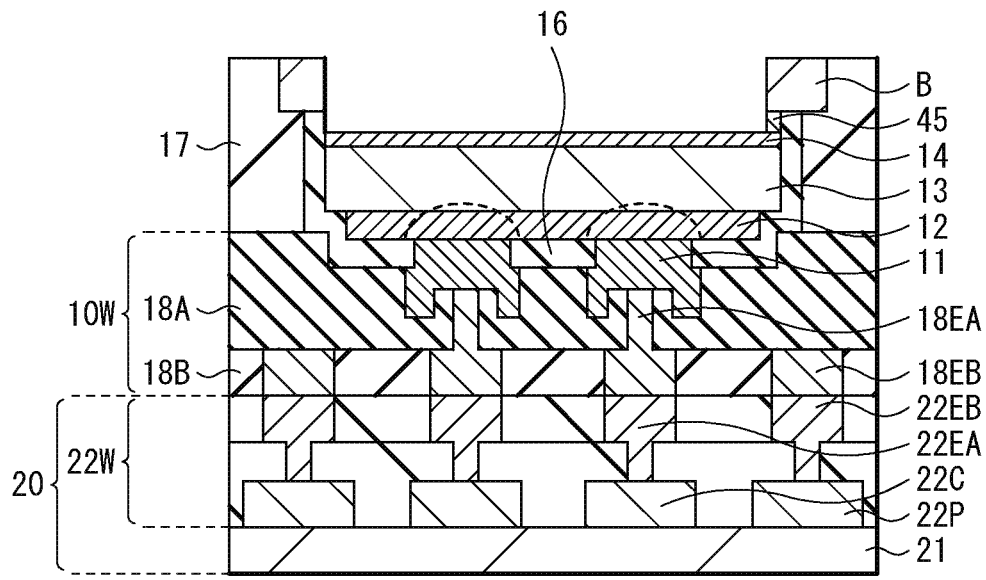
[ FIG. 7B ]
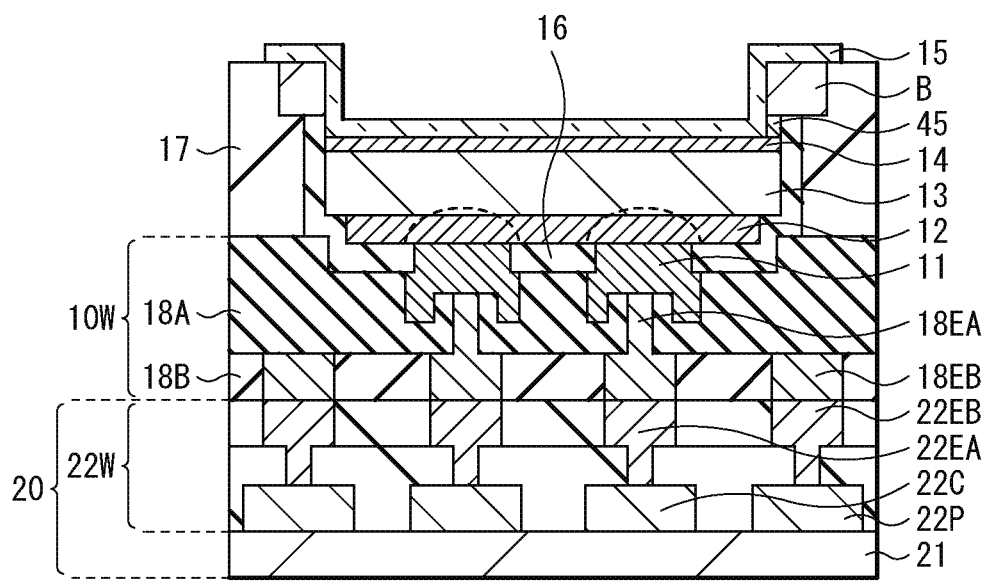

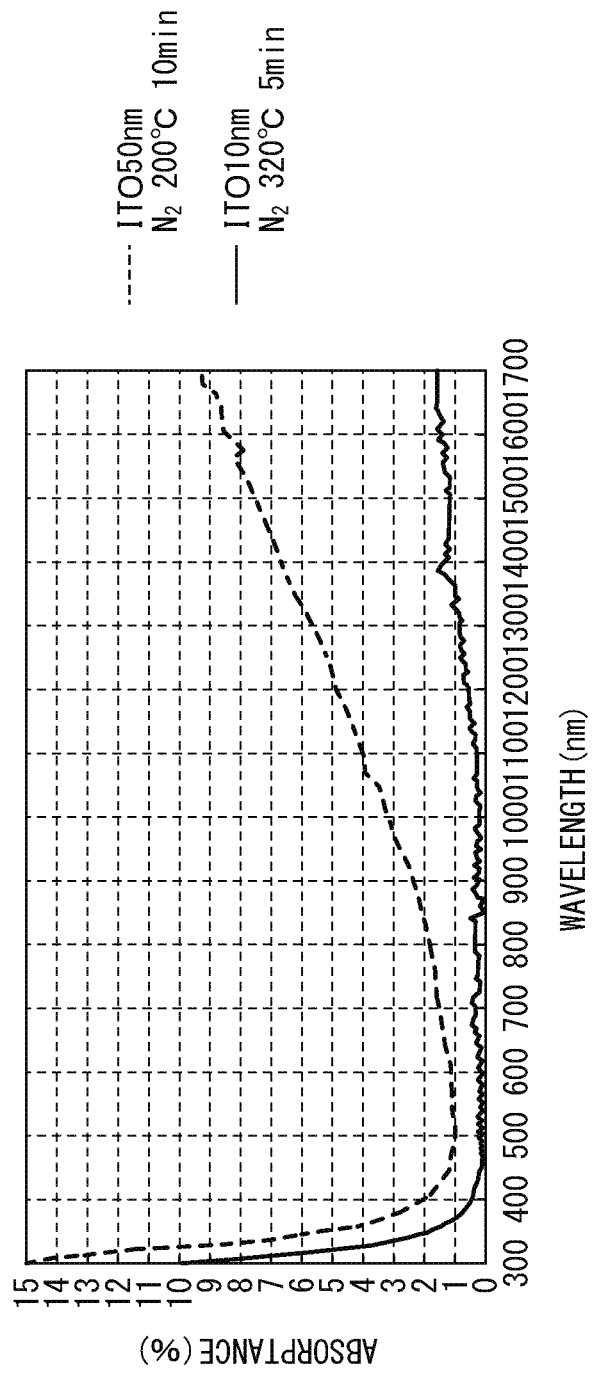
[FIG. 8]

[FIG. 9]
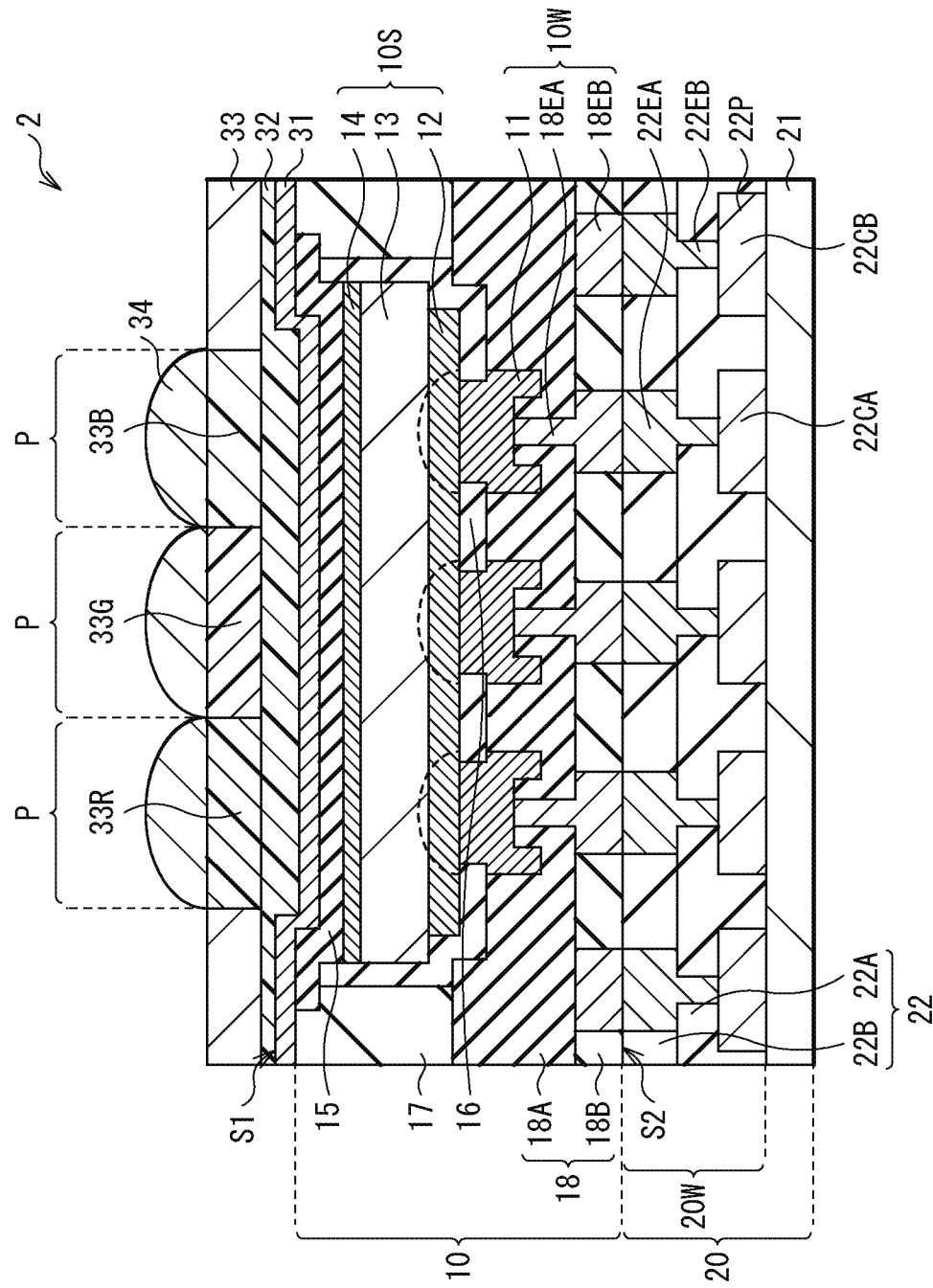

[ FIG. 10 ]
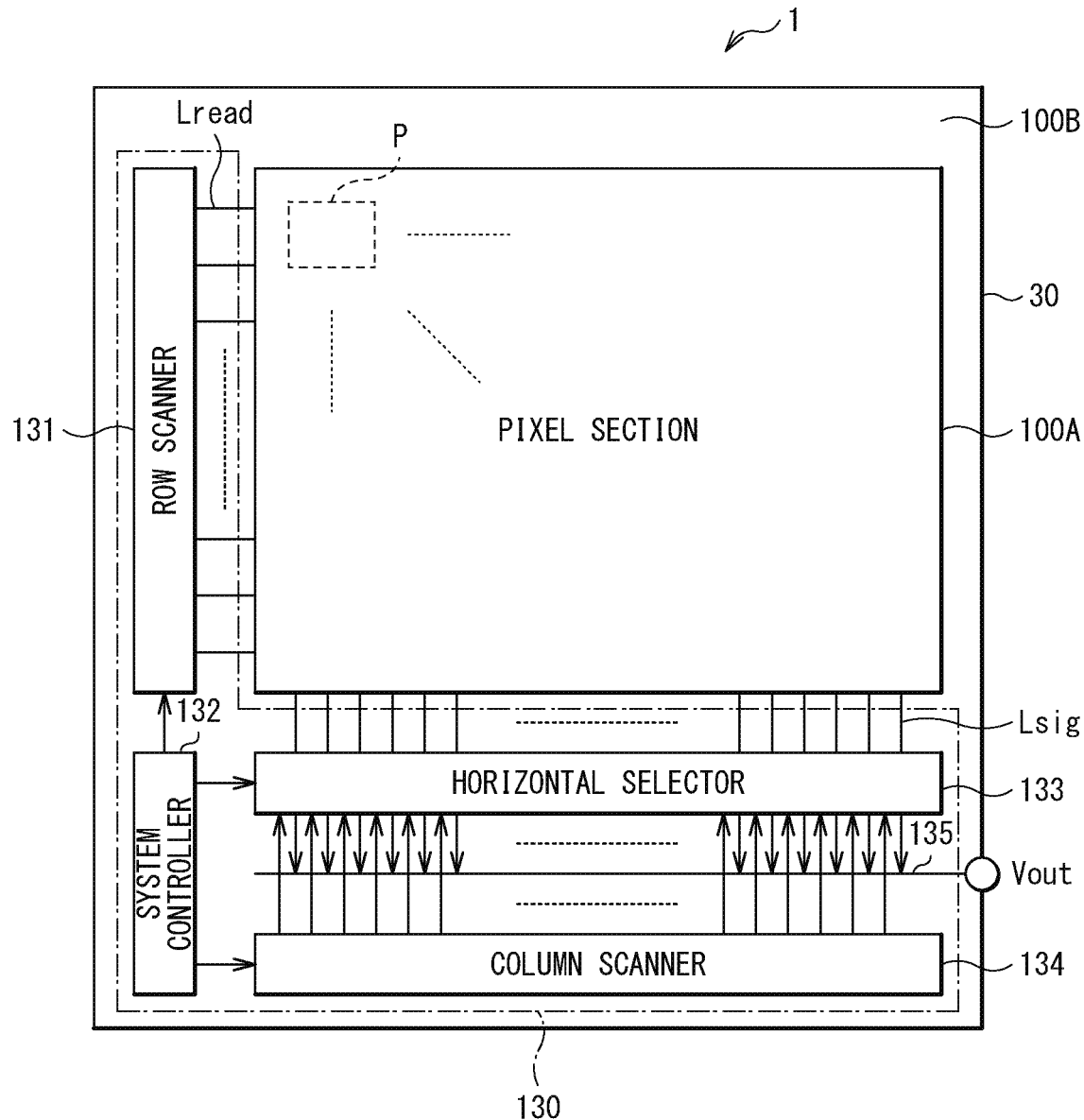
[ FIG. 11 ]
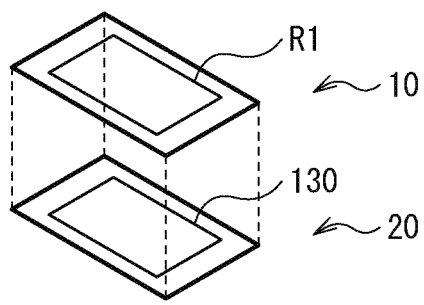

[ FIG. 12 ]
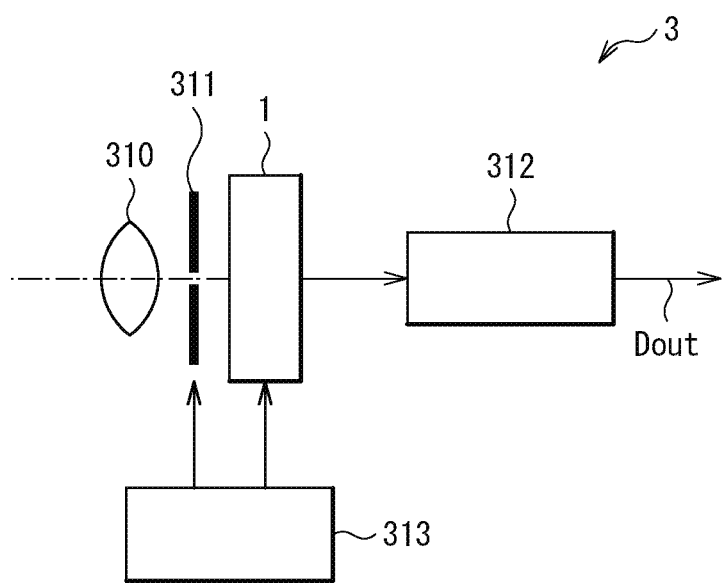

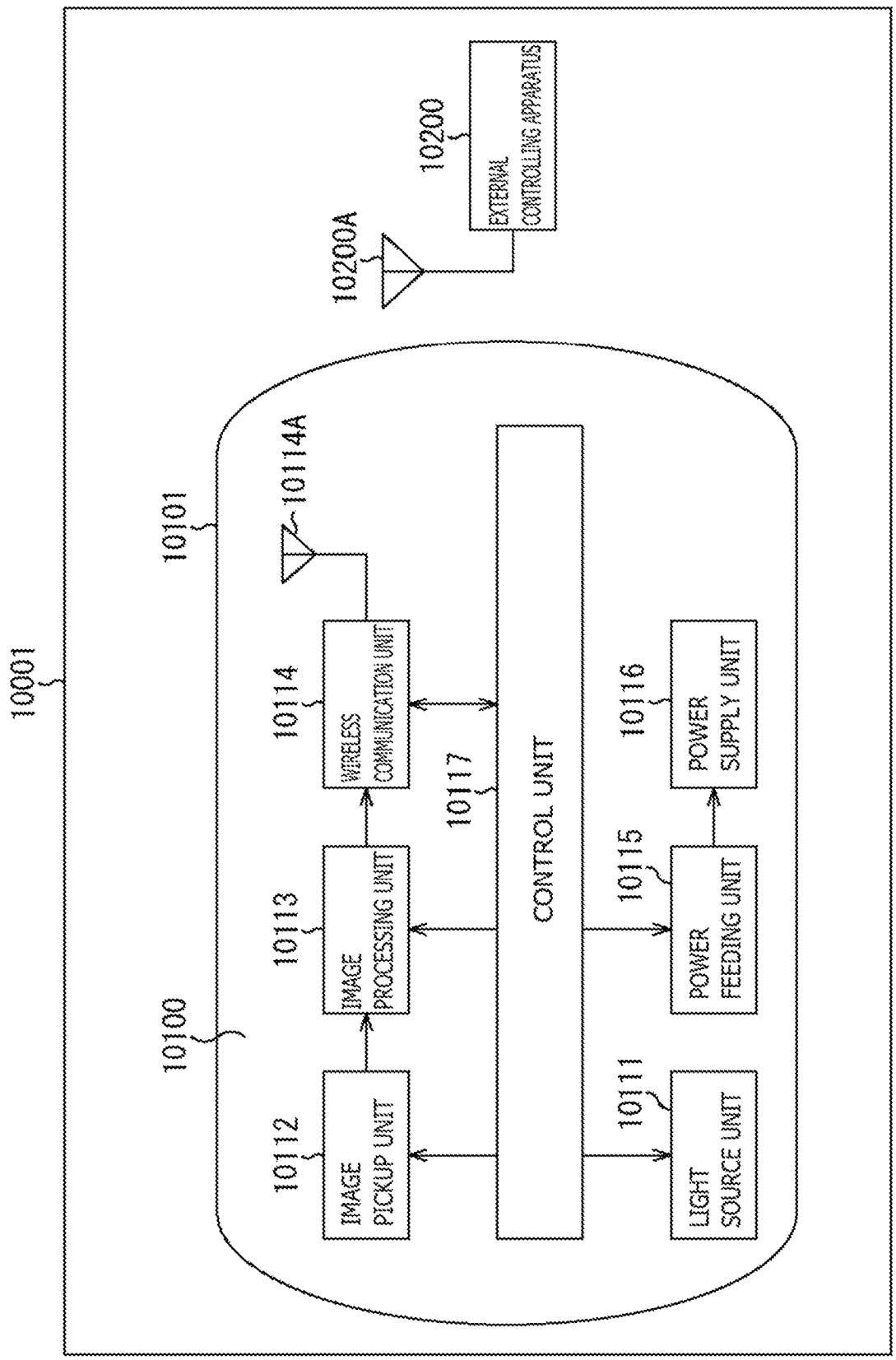
[ FIG. 13 ]

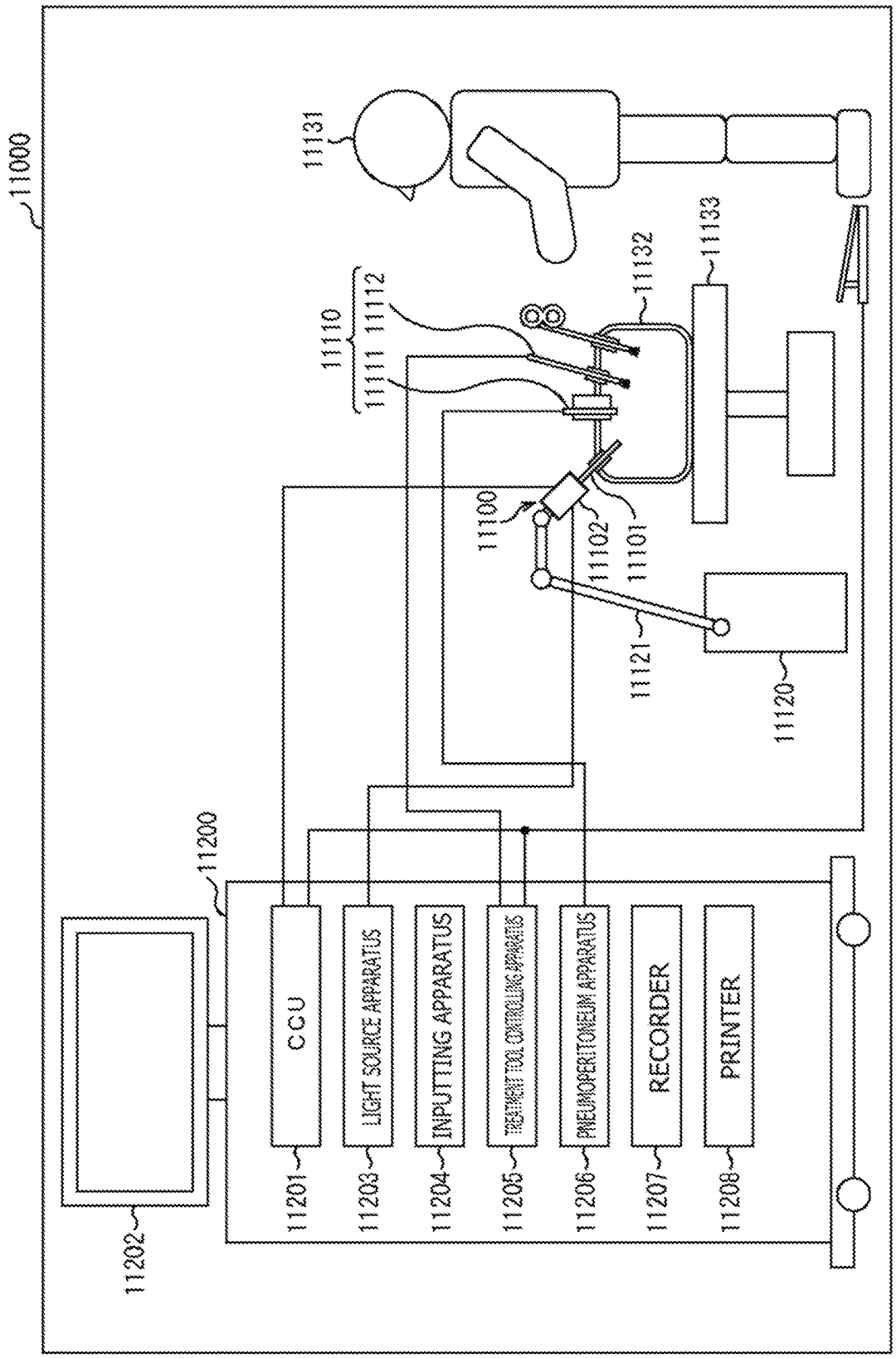
[FIG. 14]

[ FIG. 15 ]
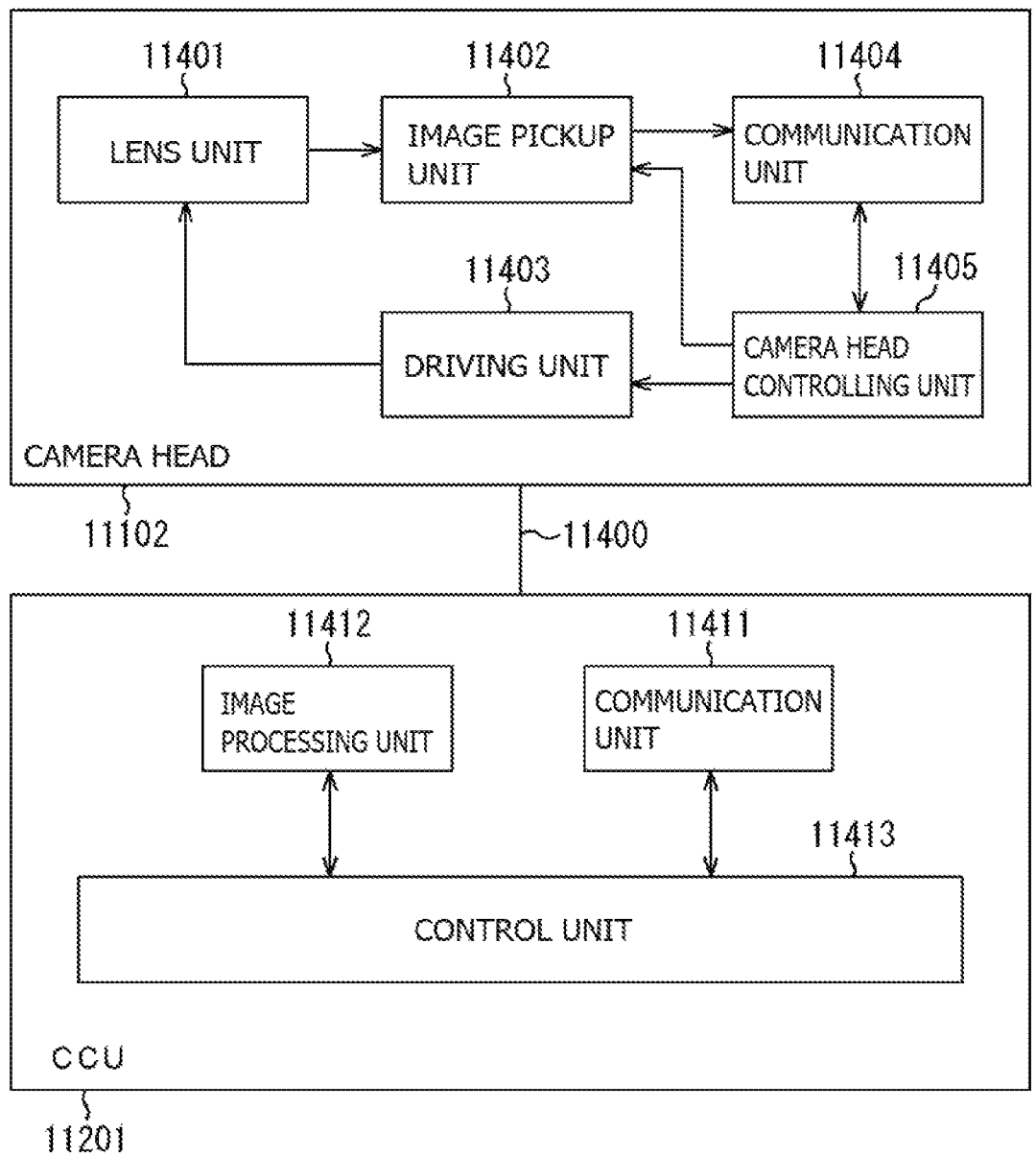

[ FIG. 16 ]
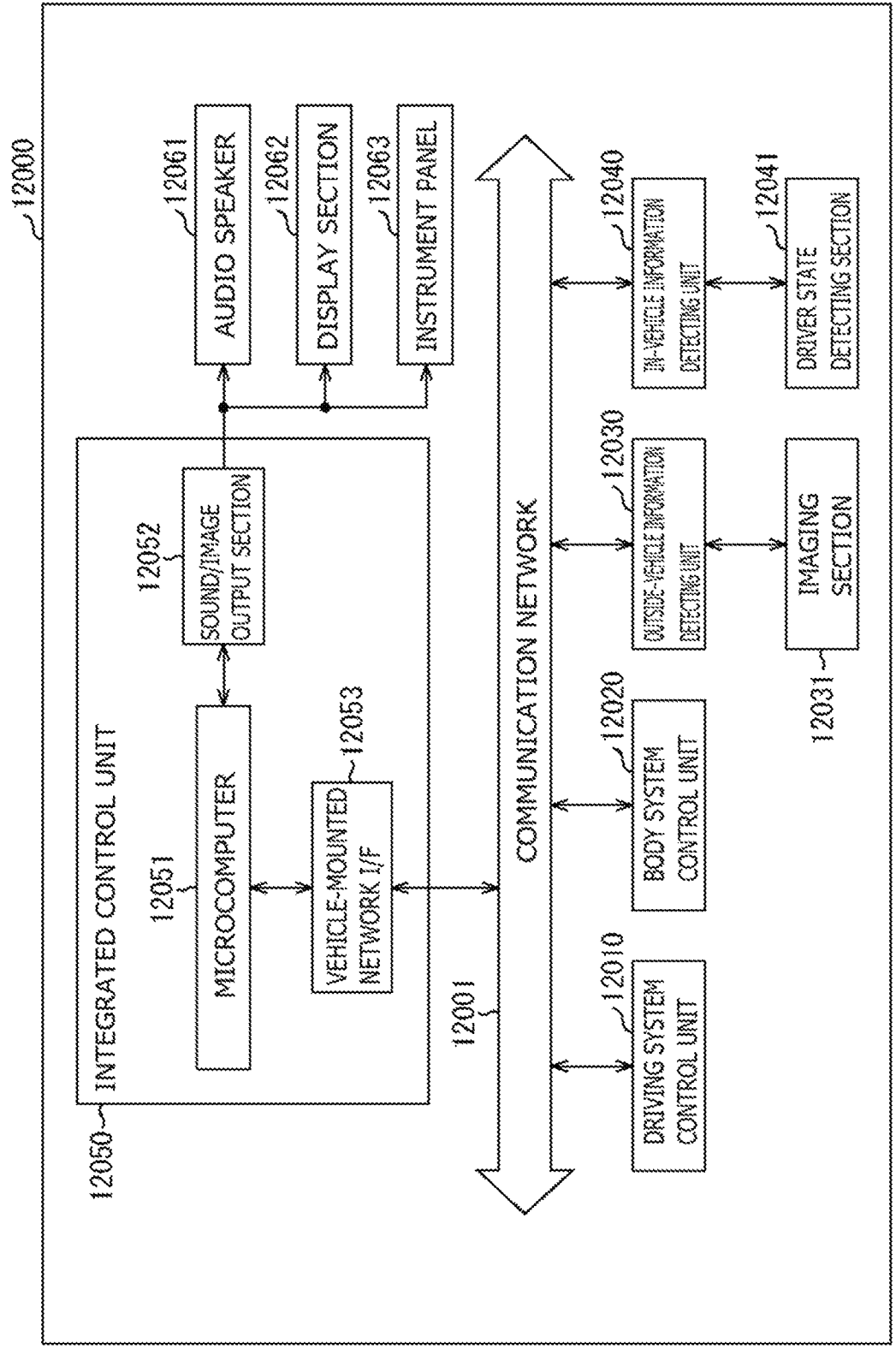

[ FIG. 17 ]
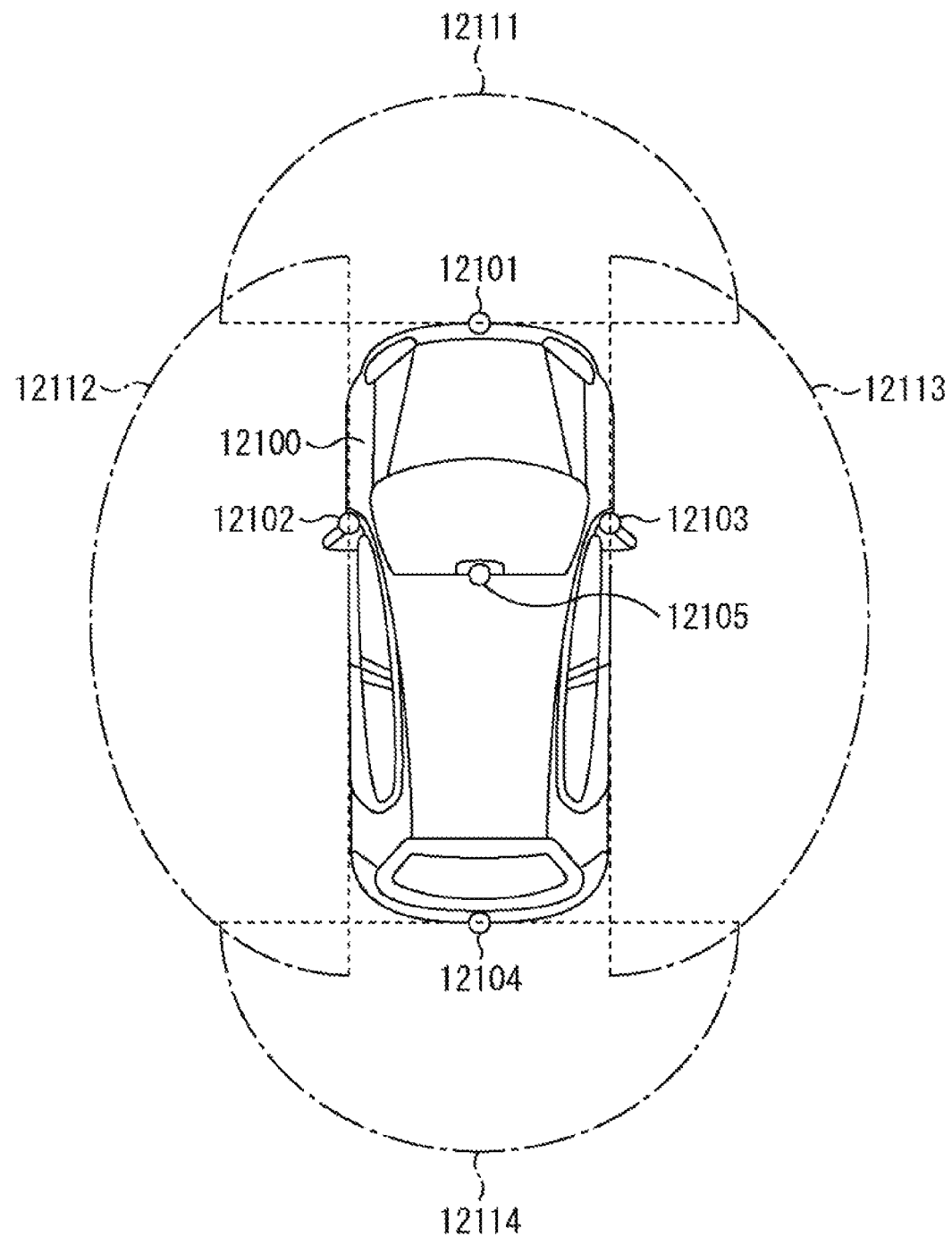

US 12,074,178 B2

IMAGING DEVICE AND ELECTRONIC APPARATUS

CROSS REFERENCE TO RELATED APPLICATIONS

This application is a U.S. National Phase of International Patent Application No. PCT/JP2019/045725 filed on Nov. 22, 2019, which claims priority benefit of Japanese Patent Application No. JP 2018-247892 filed in the Japan Patent Office on Dec. 28, 2018. Each of the above-referenced applications is hereby incorporated herein by reference in its entirety.

TECHNICAL FIELD

The present disclosure relates to, for example, an imaging device to be used in an infrared sensor or the like, and to an electronic apparatus including the same.

BACKGROUND ART

In an imaging device that performs photoelectric conversion on a wavelength in a visible range, an electrode positioned on a light entering side is generally formed using a transparent electrically conductive material such as ITO (e.g., see PTL 1).

CITATION LIST

Patent Literature

PTL 1: Japanese Unexamined Patent Application Publication No. 2017-157816

SUMMARY OF THE INVENTION

However, in a case where ITO is used as an electrode material in an infrared sensor, the ITO exhibits absorption with respect to a wavelength in a near-infrared range or longer, for example. Therefore, there is an issue that sensitivity is decreased.

It is desirable to provide an imaging device and an electronic apparatus that make it possible to improve sensitivity.

An imaging device according to one embodiment of the present disclosure includes a first electrode, a second electrode, and a photoelectric converter. The first electrode includes an oxide semiconductor material having an amorphous state. The second electrode is opposed to the first electrode. The photoelectric converter is provided between the first electrode and the second electrode, and includes a compound semiconductor material.

An electronic apparatus according to one embodiment of the present disclosure includes the imaging device according to the embodiment of the present disclosure described above.

In the imaging device of the embodiment and the electronic apparatus of the embodiment of the present disclosure, of the first electrode and the second electrode that are opposed to each other with the photoelectric converter including the compound semiconductor material therebetween, the first electrode is formed using the oxide semiconductor material having the amorphous state. Accordingly, absorption of a wavelength in a near-infrared range or shorter by the first electrode is reduced.

BRIEF DESCRIPTION OF DRAWINGS

FIG. 1 is a schematic cross-sectional view of an example of an outline configuration of an imaging device according to an embodiment of the present disclosure.

FIG. 2 is a schematic cross-sectional view of another example of a configuration of a first electrode of the imaging device illustrated in FIG. 1.

FIG. 3A is a schematic cross-sectional view for describing one process of a method of manufacturing the imaging device illustrated in FIG. 1.

FIG. 3B is a schematic cross-sectional view of a process following that in FIG. 3A.

FIG. 4A is a schematic cross-sectional view of a process following that in FIG. 3B.

FIG. 4B is a schematic cross-sectional view of a process following that in FIG. 4A.

FIG. 5A is a schematic cross-sectional view of a process following that in FIG. 4B.

FIG. 5B is a schematic cross-sectional view of a process following that in FIG. 5A.

FIG. 6A is a schematic cross-sectional view of a process following that in FIG. 5B.

FIG. 6B is a schematic cross-sectional view of a process following that in FIG. 6A.

FIG. 7A is a schematic cross-sectional view of a process following that in FIG. 6B.

FIG. 7B is a schematic cross-sectional view of a process following that in FIG. 7A.

FIG. 8 is a diagram illustrating a wavelength absorption property based on a film thickness of an ITO film.

FIG. 9 is a schematic cross-sectional view of an example of an outline configuration of an imaging device according to a modification of the present disclosure.

FIG. 10 is a block diagram illustrating a configuration of the imaging device.

FIG. 11 is a schematic diagram illustrating an example of a configuration of a stacked-type imaging device.

FIG. 12 is a functional block diagram illustrating an example of an electronic apparatus (a camera) using a solid-state imaging unit illustrated in FIG. 10.

FIG. 13 is a block diagram depicting an example of a schematic configuration of an in-vivo information acquisition system.

FIG. 14 is a view depicting an example of a schematic configuration of an endoscopic surgery system.

FIG. 15 is a block diagram depicting an example of a functional configuration of a camera head and a camera control unit (CCU).

FIG. 16 is a block diagram depicting an example of schematic configuration of a vehicle control system.

FIG. 17 is a diagram of assistance in explaining an example of installation positions of an outside-vehicle information detecting section and an imaging section.

MODES FOR CARRYING OUT THE INVENTION

In the following, an embodiment of the present disclosure is described in detail with reference to the drawings. The following description is a specific example of the present disclosure, and the present disclosure is not limited to the following embodiment. Further, the present disclosure is not limited to arrangement, dimensions, dimensional ratios, and the like of the respective constituent elements illustrated in the drawings. Note that the description is given in the following order.

1. Embodiment (An example of an imaging device including an amorphous-state electrode on a light entering side)
   1-1. Configuration of Imaging Device
   1-2. Method of Manufacturing Imaging Device
   1-3. Operation of Imaging Device
   1-4. Workings and Effects
2. Modification (an example with a color filter and an on-chip lens)
3. Application Examples

1. EMBODIMENT

FIG. 1 schematically illustrates a cross-sectional configuration of an imaging device (an imaging device 1) according to an embodiment of the present disclosure. The imaging device 1 is to be applied to, for example, an infrared sensor using a compound semiconductor material such as a Group III-V semiconductor, etc. The imaging device 1 has a photoelectric conversion function, for example, for light having a wavelength from a visible range (for example, longer than or equal to 380 nm and shorter than 780 nm) to a short infrared range (for example, longer than or equal to 780 nm and shorter than 2400 nm). This imaging device 1 is provided with, for example, two or more light reception unit regions (pixels P) that are disposed two-dimensionally. FIG. 1 illustrates a cross-sectional configuration of a part corresponding to three pixels P.

(1-1. Configuration of Imaging Device)

The imaging device 1 has a stacked structure of a device substrate 10 and a circuit substrate 20. One surface of the device substrate 10 is a light entering surface (a light entering surface S1), and a surface (the other surface) opposite from the light entering surface S1 is a bonding surface (a bonding surface S2) with respect to the circuit substrate 20. The device substrate 10 includes interlayer insulating films 18 (18B and 18A), a second contact layer 12, a photoelectric conversion layer 13, a first contact layer 14, and a first electrode 15 that are stacked in this order from the circuit substrate 20 side. For example, the second contact layer 12, the photoelectric conversion layer 13, and the first contact layer 14 provide a photoelectric converter 10S that is common to two or more pixels P. In the present embodiment, the first electrode 15 provided on the light entering surface S1 side of the photoelectric converter 10S has a configuration formed using an oxide semiconductor material having an amorphous state.

As described above, the device substrate 10 includes the interlayer insulating films 18B and 18A, the second contact layer 12, the photoelectric conversion layer 13, the first contact layer 14, and the first electrode 15 in this order from a position close to the circuit substrate 20. The interlayer insulating films 18 are provided with a wiring layer 10W including the second electrode 11. A surface, of the photoelectric converter 10S, opposed to the wiring layer 10W and end surfaces (side surfaces) of the photoelectric converter 10S are covered with an insulating film 16. The circuit substrate 20 includes a wiring layer 20W and a support substrate 21. The wiring layer 20W is in contact with the bonding surface S2 of the device substrate 10. The support substrate 21 is opposed to the device substrate 10 with this wiring layer 20W therebetween.

The device substrate 10 may be provided with a pixel region 100A, for example, in a middle part thereof. The pixel region 100A is a light reception region. The photoelectric converter 10S is disposed in this pixel region 100A. In other words, a region where the photoelectric converter 10S is provided is the pixel region 100A. A peripheral region 100B surrounding the pixel region 100A is provided outside the pixel region 100A. The insulating film 16 and an embedding layer 17 are provided in the peripheral region 100B of the device substrate 10. The photoelectric converter 10S has a configuration in which the second contact layer 12, the photoelectric conversion layer 13, and the first contact layer 14 are stacked in this order. The second contact layer 12, the photoelectric conversion layer 13, and the first contact layer 14 include, for example, a compound semiconductor material such as a Group III-V semiconductor. The second contact layer 12, the photoelectric conversion layer 13, and the first contact layer 14 have, for example, approximately the same planar shapes. The first electrode 15 is provided on the light entering surface S1 side of the photoelectric converter 10S, as described above, and the second electrode 11 is provided on an opposite side from the light entering surface S1. A signal charge subjected to the photoelectric conversion in the photoelectric converter 10S moves through the wiring layer 10W including the second electrode 11 and is read in the circuit substrate 20. A configuration of each section is described below.

The wiring layer 10W includes the second electrode 11 and contact electrodes 18EA and 18EB, for example, in the interlayer insulating films 18 (18A and 18B).

The second electrode 11 is an electrode (an anode) supplied with a voltage for reading a signal charge (which is a hole or an electron, and the following description is given on the assumption that the signal charge is the hole, for convenience) generated in the photoelectric conversion layer 13. The second electrode 11 is provided for each pixel P in the pixel region 100A. The second electrode 11 is provided in a coupling hole of the interlayer insulating film 18A and the insulating film 16, and is in contact with the second contact layer 12 of the photoelectric converter 10S. Adjacent second electrodes 11 are electrically separated by the interlayer insulating film 18 and the insulating film 16.

The second electrode 11 includes, for example, a simple substance of any one of titanium (Ti), tungsten (W), titanium nitride (TiN), platinum (Pt), gold (Au), germanium (Ge), palladium (Pd), zinc (Zn), nickel (Ni), and aluminum (Al), or an alloy including at least one of them. The second electrode 11 may be a single film of such a constituent material, or may be a stacked film of a combination of two or more of them. For example, the second electrode 11 includes a stacked film (Ti/W) of titanium and tungsten.

The interlayer insulating films 18 (18A and 18B) are provided across the pixel region 100A and the peripheral region 100B, and have the bonding surface S2 with respect to the circuit substrate 20. The bonding surface S2 in the pixel region 100A and the bonding surface in the peripheral region 100B form the same plane. The interlayer insulating films 18A and 18B provide a stacked structure. For example, the interlayer insulating film 18A is disposed on the second contact layer 12 side, and the interlayer insulating film 18B is disposed on the circuit substrate 20 side. The interlayer insulating films 18A and 18B include, for example, an inorganic insulating material. Examples of the inorganic insulating material include silicon nitride (SiN), aluminum oxide ($Al_2O_3$), silicon oxide ($SiO_2$), and hafnium oxide ($HfO_2$). The interlayer insulating films 18A and 18B may be formed using inorganic insulating materials that differ from each other, or may be formed using the same inorganic insulating material.

The contact electrode 18EA is adapted to electrically couple the second electrode 11 and the circuit substrate 20. The contact electrode 18EA is provided for each pixel P in the pixel region 100A. Adjacent contact electrodes 18EA are electrically separated by the interlayer insulating films 18.

The contact electrode 18EB is disposed in the peripheral region 100B. The contact electrode 18EB is adapted to electrically couple the first electrode 15 and a wiring (a wiring 22CB which will be described later) of the circuit substrate 20. Although it is not illustrated, for example, a through electrode running through the embedding layer 17 and the interlayer insulating films 18 is provided in the peripheral region 100B. The contact electrode 18EB is electrically coupled to, for example, the first electrode 15 via this through electrode. The contact electrode 18EB is formed, for example, in the same process as that of the contact electrode 18EA. The contact electrodes 18EA and 18EB include, for example, copper (Cu) pads, and are exposed on the bonding surface S2.

The second contact layer 12 is provided, for example, in common to all of the pixels P. The second contact layer 12 is disposed between the insulating film 16 and the photoelectric conversion layer 13. The second contact layer 12 is adapted to electrically separate the adjacent pixels P. The second contact layer 12 is provided with, for example, two or more diffusion regions 12A. By using, for the second contact layer 12, a compound semiconductor material having a band gap larger than a band gap of the compound semiconductor material included in the photoelectric conversion layer 13, it is also possible to suppress a dark current. As the second contact layer 12, for example, n-type InP (indium phosphorus) may be used.

The diffusion regions 12A provided in the second contact layer 12 are disposed being separated away from each other. The diffusion region 12A is disposed for each pixel P. The second electrode 11 is coupled to each of the diffusion regions 12A. The diffusion region 12A is adapted to read the signal charge generated in the photoelectric conversion layer 13 for each pixel P. The diffusion region 12A includes, for example, a p-type impurity. Examples of the p-type impurity include Zn (zinc). Thus, a pn junction interface is formed between the diffusion region 12A and the second contact layer 12 other than the diffusion region 12A, thereby electrically separating the adjacent pixels P. The diffusion region 12A is provided, for example, in the second contact layer 12 in a thickness direction, and is also provided in a portion of the photoelectric conversion layer 13 in the thickness direction.

The photoelectric conversion layer 13 between the second electrode 11 and the first electrode 15, more specifically, between the second contact layer 12 and the first contact layer 14 is provided, for example, in common to all of the pixels P. The photoelectric conversion layer 13 absorbs light having a predetermined wavelength to generate a signal charge. The photoelectric conversion layer 13 includes, for example, a compound semiconductor material such as an i-type Group III-V semiconductor. Examples of the compound semiconductor material included in the photoelectric conversion layer 13 include InGaAs (indium gallium arsenide), InAsSb (indium arsenic antimony), InAs (indium arsenic), InSb (indium antimony), and HgCdTe (mercury cadmium tellurium). The photoelectric conversion layer 13 may include Ge (germanium). In the photoelectric conversion layer 13, for example, photoelectric conversion of light having a wavelength from a visible range to a short infrared range is performed.

The first contact layer 14 is provided, for example, in common to all of the pixels P. The first contact layer 14 is provided between the photoelectric conversion layer 13 and the first electrode 15, and is in contact with them. The first contact layer 14 is a region to which a charge discharged from the first electrode 15 moves, and includes, for example, a compound semiconductor including an n-type impurity. For example, n-type InP (indium phosphorus) can be used for the first contact layer 14. The thickness of the first contact layer 14 is, for example, greater than or equal to 20 nm and less than or equal to 1000 nm.

The first electrode 15 is provided, for example, as a common electrode for two or more pixels P. The first electrode 15 is so provided on the first contact layer 14 (on a light entering side) as to be in contact with the first contact layer 14. The first electrode 15 is an electrode (a cathode) adapted to discharge a charge not used as a signal charge, of the charges generated in the photoelectric conversion layer 13. For example, in a case where a hole is read from the second electrode 11 as a signal charge, for example, an electron can be discharged through the first electrode 15.

The first electrode 15 includes, for example, an electrically conductive film that is able to transmit entering light having a wavelength shorter than or equal to 1700 nm. In the present embodiment, the first electrode 15 is formed using an oxide semiconductor material having an amorphous state. Here, the amorphous state is a substance state containing a non-crystalline state. Note that the first electrode 15 may include, for example, a state other than the amorphous state such as a crystalline state, as long as effects of the present embodiment are not prevented. Examples of the oxide semiconductor material include ITO (Indium Tin Oxide). Although details will be described later, the first electrode 15 can be formed, for example, by performing an annealing process, for example, at a temperature higher than or equal to 200° C. and lower than or equal to 450° C., for example, in a nitrogen ($N_2$) gas atmosphere. The thickness of the first electrode 15 is, for example, greater than or equal to 1 nm and less than or equal to 50 nm, and is preferably greater than or equal to 1 nm and less than or equal to 30 nm.

Further, for example, as illustrated in FIG. 2, the first electrode 15 may be formed as a stacked film of an electrode layer 15A (a first electrode layer) and an electrode layer 15B (a second electrode layer). In this case, as described above, the electrode layer 15A can be formed using, for example, ITO having an amorphous state. The thickness of the electrode layer 15A is, for example, greater than or equal to 1 nm and less than or equal to 50 nm, and is preferably greater than or equal to 1 nm and less than or equal to 30 nm. For example, titanium oxide, IZO (indium oxide-zinc oxide), IGZO, or the like can be used for the electrode layer 15B. Note that it suffices that, for example, an absorptance of the electrode layer 15B for the infrared range is, for example, less than 15%. Within the above-described range, the electrode layer 15B does not necessarily have to be in an amorphous state, and may be in a crystalline state, as with a general electrode.

A protective film 31 covers the first electrode 15 in the pixel region 100A and the peripheral region 100B from the light entering surface S1 side. As the protective film 31, for example, silicon oxide ($SiO_x$), silicon nitride ($Si_xN_y$), silicon carbide (SiC), silicon oxynitride (SiON), or the like can be used.

The passivation film 32 is provided, for example, on the protective film 31. The passivation film 32 covers the pixel region 100A and the peripheral region 100B. The passivation film 32 may have an anti-reflection function. For the passivation film 32, for example, silicon nitride (SiN), aluminum oxide ($Al_2O_3$), silicon oxide ($SiO_2$), tantalum oxide ($Ta_2O_3$), or the like can be used.

The insulating film 16 is provided between the second contact layer 12 and the wiring layer 10W. In addition, the insulating film 16 covers a bottom surface and end surfaces of the second contact layer 12, end surfaces of the photoelectric conversion layer 13, and end surfaces of the first contact layer 14, and is in contact with the first electrode 15. The insulating film 16 includes, for example, an oxide such as silicon oxide ($SiO_2$) or aluminum oxide ($Al_2O_3$). The insulating film 16 may be configured as a stacked structure including two or more films. The insulating film 16 may include, for example, a silicon (Si)-based insulating material such as silicon oxynitride (SiON), carbon-containing silicon oxide (SiOC), silicon nitride (SiN), or silicon carbide (SiC).

The embedding layer 17 is adapted to fill in a level difference between a temporary substrate (a temporary substrate 43 in FIG. 3B which will be described later) and the photoelectric converter 10S in the manufacturing process of the imaging device 1. Although details will be described later, in the present embodiment, because this embedding layer 17 is formed, occurrence of defects in the manufacturing process due to the level difference between the photoelectric converter 10S and the temporary substrate 43 is suppressed.

The embedding layer 17 is provided between the wiring layer 10W and the protective film 31. For example, the embedding layer 17 has a thickness greater than or equal to the thickness of the photoelectric converter 10S. Here, the embedding layer 17 is provided to surround the photoelectric converter 10S. Therefore, the region (the peripheral region 100B) around the photoelectric converter 10S is formed. Thus, it is possible to provide the bonding surface S2 with respect to the circuit substrate 20 in this peripheral region 100B. If the bonding surface S2 is formed in the peripheral region 100B, the thickness of the embedding layer 17 may be reduced. However, it is preferable that the embedding layer 17 cover the photoelectric converter 10S all the way in the thickness direction and the entire end surfaces of the photoelectric converter 10S be covered with the embedding layer 17. By covering, with the embedding layer 17, the entire end surfaces of the photoelectric converter 10S with the insulating film 16 therebetween, it is possible to effectively suppress entering of water into the photoelectric converter 10S.

A surface of the embedding layer 17 on the bonding surface S2 side is planarized. In the peripheral region 100B, the wiring layer 10W is provided on this planarized surface of the embedding layer 17. For the embedding layer 17, for example, an inorganic insulating material such as silicon oxide ($SiO_2$), silicon nitride (SiN), silicon oxynitride (SiON), carbon-containing silicon oxide (SiOC), or silicon carbide (SiC) can be used.

The support substrate 21 is adapted to support the wiring layer 20W. The support substrate 21 includes, for example, silicon (Si). The wiring layer 20W includes contact electrodes 22EA and 22EB, a pixel circuit 22CA, and a wiring 22CB in interlayer insulating films 22 (22A and 22B), for example. The interlayer insulating films 22A and 22B include, for example, an inorganic insulating material. Examples of the inorganic insulating material include silicon nitride (SiN), aluminum oxide ($Al_2O_3$), silicon oxide ($SiO_2$), and hafnium oxide ($HfO_2$). The interlayer insulating films 22A and 22B may be formed using inorganic insulating materials that differ from each other, or may be formed using the same inorganic insulating material.

The contact electrode 22EA is provided, for example, in the pixel region 100A. The contact electrode 22EA is adapted to electrically couple the second electrode 11 and the pixel circuit 22CA. The contact electrode 22EA is in contact with the contact electrode 18EA on the bonding surface S2 of the device substrate 10. Adjacent contact electrodes 22EA are electrically separated by the interlayer insulating films 22A and 22B.

The contact electrode 22EB is provided, for example, in the peripheral region 100B. The contact electrode 22EB is adapted to electrically couple the first electrode 15 and the wiring 22CB of the circuit substrate 20. The contact electrode 22EB is in contact with the contact electrode 18EB on the bonding surface S2 of the device substrate 10. The contact electrode 22EB is formed, for example, in the same process as that of the contact electrode 22EA.

The contact electrodes 22EA and 22EB include, for example, copper (Cu) pads. The contact electrodes 22EA and 22EB are exposed on a surface, of the circuit substrate 20, opposed to the device substrate 10. That is, for example, CuCu bonding is provided between the contact electrode 18EA and the contact electrode 22EA, and between the contact electrode 18EB and the contact electrode 22EB.

The pixel circuit 22CA is provided for each pixel P, for example, in the pixel region 100A. The pixel circuit 22CA is coupled to the contact electrode 22EA. This pixel circuit 22CA provides an ROIC. The wiring 22CB is provided, for example, in the peripheral region 100B. The wiring 22CB is coupled to the contact electrode 22EB and is coupled, for example, to a predetermined potential. Thus, one (e.g., a hole) of the charges generated in the photoelectric conversion layer 13 is read from the second electrode 11 to the pixel circuit 22CA via the contact electrodes 18EA and 22EA. The other (e.g., an electron) of the charges generated in the photoelectric conversion layer 13 is discharged from the first electrode 15 to the predetermined potential via the through electrode (not illustrated) and the contact electrodes 18EB and 22EB.

(1-2. Method of Manufacturing Imaging Device)

The imaging device 1 can be manufactured, for example, as follows. FIGS. 3A, 3B, 4A, 4B, 5A, 5B, 6A, 6B, 7A, and 7B illustrate the manufacturing processes of the imaging device 1 in process order.

First, as illustrated in FIG. 3A, for example, a buffer layer 44B including n-type InP, a stopper layer 44S including i-type InGaAs, the photoelectric converter 10S, and a cap layer 45A including i-type InGaAs are formed in this order on a growth substrate 41 by epitaxial growth. The diameter of the growth substrate 41 is, for example, less than or equal to 6 inches. As the photoelectric converter 10S, for example, the second contact layer 12 including n-type InP, the photoelectric conversion layer 13 including i-type or n-type InGaAs, and the first contact layer 14 including n-type InP are formed in this order.

The cap layer 45 is adapted to prevent the photoelectric converter 10S and an adhesive layer B from coming into direct contact with each other. The adhesive layer B is adapted to bond the photoelectric converter 10S to the temporary substrate 43. If the process proceeds while the adhesive layer B is in contact with the photoelectric converter 10S, properties of the photoelectric converter 10S may deteriorate due to, for example, energy application such as deposition, impurity diffusion, or annealing. In particular, in a case where the first contact layer 14 of the photoelectric converter 10S, which is disposed at a position close to the adhesive layer B, includes phosphorus (P), phosphorus may be lost due to the energy application. Alternatively, the adhesive layer B may be denatured by energy application, and the photoelectric converter 10S may be peeled off from the temporary substrate 43. By forming the cap layer 45 between the photoelectric converter 10S and the adhesive layer B32, it is possible to suppress occurrence of such deterioration of the properties, the peeling-off of the film, and the like. It suffices that the cap layer 45 is a semiconductor material that can be epitaxially grown on the photoelectric converter 10S (more specifically, the first contact layer 14). For example, InGaAs, InAsSb, or the like can be used for the cap layer 45.

After the cap layer 45A is formed on the photoelectric converter 10S, an annealing process is performed. This annealing process is for preparing for rapid energy application in a later process of forming the diffusion region 12A. Compared with the heating time and the heating temperature of the process of forming the diffusion region 12A, the heating time and the heating temperature of this annealing process preferably involve a longer time or a higher temperature. Alternatively, they may involve both a longer time and a higher temperature. Thereafter, the adhesive layer B including, for example, silicon oxide ($SiO_2$) is formed on the cap layer 45A, and an annealing process is performed. Only one of the annealing process after forming the cap layer 45A and the annealing process after forming the adhesive layer B may be performed.

Thereafter, as illustrated in FIG. 3B, the growth substrate 41 is bonded to the temporary substrate 43 having a large diameter with the adhesive layer B therebetween. At this time, the cap layer 45A is interposed between the adhesive layer B and the first contact layer 14. For example, tetraethoxysilane (TEOS), silicon oxide ($SiO_2$), etc. can be used for the adhesive layer B. For the temporary substrate 43, for example, a silicon (Si) substrate having a diameter larger than that of the growth substrate 41 is used. The diameter of the temporary substrate 43 is, for example, from 8 inches to 12 inches. By bonding the growth substrate 41 having a small diameter to the temporary substrate 43 having a large diameter, it is possible to use various apparatuses for a substrate having a large diameter when forming the device substrate 10. Accordingly, for example, it is possible to allow the bonding between the circuit substrate 20 and the device substrate 10 to be the CuCu bonding, and to allow the pixels P to be finer. The bonding of the growth substrate 41 to the temporary substrate 43 may be performed by plasma-activated bonding, ambient temperature bonding, bonding using an adhesive (adhesive bonding), or the like. Thus, for example, the wafer-shaped photoelectric converter 10S is bonded to the temporary substrate 43. Note that the photoelectric converter 10S is not limited to the wafer shape, and may be fragmented into a chip shape.

After the growth substrate 41 on which the photoelectric converter 10S is formed is bonded to the temporary substrate 43, as illustrated in FIG. 4A, the growth substrate 41 is removed. The growth substrate 41 can be removed by mechanical grinding, CMP (Chemical Mechanical Polishing: chemical mechanical polishing), wet etching, dry etching, or the like.

Thereafter, as illustrated in FIG. 4B, the positional deviation of the photoelectric converter 10S with respect to the temporary substrate 43 is corrected. Specifically, the positional deviation of the photoelectric converter 10S is corrected, for example, by photolithography and etching. A resist (a resist PR) is formed on the photoelectric converter 10S, and etching of the photoelectric converter 10S is performed where appropriate. The etching can be performed by dry etching, wet etching, or the like. Thus, an unnecessary part of the photoelectric converter 10S is removed, and it is possible to leave the photoelectric converter 10S only in a defined region (the pixel region 100A) of the temporary substrate 43. Thus, by correcting the positional deviation of the photoelectric converter 10S with respect to the temporary substrate 43, it is possible to suppress occurrence of misalignment in subsequent processes, and to easily form the imaging device 1 having a desired structure.

After the positional deviation of the photoelectric converter 10S with respect to the temporary substrate 43 is corrected, the insulating film 16 is formed on the entire surface of the temporary substrate 43 as illustrated in FIG. 5A. Thereafter, the diffusion region 12A is formed in the photoelectric converter 10S for each pixel P. As a result, device isolation is achieved. For example, the insulating film 16 is used as a hard mask for forming the diffusion region 12A. Specifically, after a mask having a predetermined shape is formed on the second contact layer 12, openings 16H are provided in the insulating film 16 by etching. Thereafter, the resist is peeled off, and vapor phase diffusion of the p-type impurity is performed using the insulating film 16 as a hard mask. As a result, the diffusion region 12A is formed in a selective region. The diffusion region 12A may be formed by ion implantation or the like using a resist mask. Here, the diffusion region 12A is formed on the photoelectric converter 10S provided on the temporary substrate 43 having a large diameter. Therefore, it is possible to allow the pixel P to be finer.

After the diffusion region 12A is formed in the photoelectric converter 10S, as illustrated in FIG. 5B, a film of an insulating material is formed on the entire surface of the temporary substrate 43. Thereafter, it is planarized, for example, by CMP. Thus, the embedding layer 17 providing the same plane as the upper surface (the surface farthest from the temporary substrate 43) of the photoelectric converter 10S is formed in the periphery (the peripheral region 100B) of the photoelectric converter 10S. Note that the diffusion region 12A and the embedding layer 17 may be formed in an opposite order. After the positional deviation of the photoelectric converter 10S with respect to the temporary substrate 43 is corrected, the diffusion region 12A and the embedding layer 17 may be formed in this order.

Thereafter, the wiring layer 10W including the second electrode 11 is formed on the photoelectric converter 10S. First, a film of an insulating material is formed on the entire surface of the photoelectric converter 10S and the embedding layer 17, and thereafter, openings are provided. For example, a stacked film of titanium (Ti)/tungsten (W) is formed in the opening by a CVD (Chemical Vapor Deposition) method, a PVD (Physical Vapor Deposition) method, an ALD (Atomic Layer Deposition) method, an evaporation method, or the like. Thereafter, formation is performed by patterning this stacked film by photolithography and etching. As a result, the second electrode 11 is formed. Thereafter, a film of an insulating material is further so formed as to cover the second electrode 11. Thereafter, it is planarized, for example, by CMP to form the interlayer insulating film 18A.

Next, a film of an insulating material is formed on the interlayer insulating film 18A, and it is planarized, for example, by CMP to form the interlayer insulating film 18B. Thereafter, as illustrated in FIG. 6A, an opening 18H1 and an opening 18H2 are provided on the photoelectric converter 10S (the pixel region 100A) and a region (the peripheral region 100B) other than the region on the photoelectric converter 10S, respectively. Note that the opening 18H1 provided on the photoelectric converter 10S causes a portion of the second electrode 11 to be exposed at its bottom surface. A copper (Cu) film is formed in these openings 18H1 and 18H2 of this interlayer insulating film 18B by an evaporation method, a PVD method, a plating method, or the like. Thereafter, the surface of the copper film is polished, for example, by a CMP method to form the contact electrodes 18EA and 18EB. Thus, the wiring layer 10W including the second electrode 11 and the contact electrodes 18EA and 18EB is formed. Here, the wiring layer 10W is formed on the temporary substrate 43 having the large diameter. Therefore, it is possible to use various apparatuses for a substrate having a large diameter. Further, the cap layer 45A is interposed between the adhesive layer B and the first contact layer 14 in processes of the removal of the growth substrate 41, the formation of the diffusion region 12A, the formation of the wiring layer 10W, etc. Therefore, it is possible to suppress the deterioration of the properties of the photoelectric converter 10S, the peeling off of the film, and the like.

After the wiring layer 10W is formed, as illustrated in FIG. 6B, the temporary substrate 43 is attached to the circuit substrate 20 with the wiring layer 10W therebetween. At this time, the wiring layer 20W is formed on the circuit substrate 20 in advance. The wiring layer 20W of the circuit substrate 20 includes the contact electrodes 22EA and 22EB having pad structures. When attaching the circuit substrate 20 to the temporary substrate 43, for example, the contact electrodes 22EA and 22EB of the wiring layer 20W and the contact electrodes 18EA and 18EB of the wiring layer 10W are bonded by CuCu bonding. More specifically, in the pixel region 100A, the bonding surface S2 in which the contact electrode 18EA and the contact electrode 22EA are bonded to each other is formed. In the peripheral region 100B, the bonding surface S2 in which the contact electrode 18EB and the contact electrode 22EB are bonded to each other is formed. Here, the peripheral region 100B of the device substrate 10 is also bonded to the circuit substrate 20.

Next, as illustrated in FIG. 7A, the temporary substrate 43, the adhesive layer B, and the cap layer 45 are removed in this order to thereby expose the first contact layer 14. The temporary substrate 43 can be removed, for example, by machine grinding, wet etching, dry etching, or the like. The adhesive layer B and the cap layer 45 can be removed, for example, by wet etching. For the wet etching of the adhesive layer B, for example, HF (Hydrogen Fluoride), BHF (Buffered Hydrogen Fluoride), or the like can be used. For the wet etching of the cap layer 45, for example, a mixed solution of an acid and an oxidant can be used. As the acid, for example, HF, hydrochloric acid (HCl), phosphoric acid ($H_3PO_4$), or the like can be used. As the oxidant, for example, hydrogen peroxide water, ozone water, or the like can be used. The adhesive layer B and the cap layer 45 can be removed also by dry etching; however, it is preferable to remove them by wet etching.

Note that the region where the adhesive layer B and the cap layer 45 are to be removed is made, for example, smaller than the area of the photoelectric converter 10S in a plan view. Thus, the cap layer 45 and the adhesive layer B remain in the periphery on the light entering surface S1 side of the photoelectric converter 10S (the surface opposite from the surface opposed to the circuit substrate 20), more specifically, on an end of the first contact layer 14.

After the cap layer 45 is removed, as illustrated in FIG. 7B, the first electrode 15 is formed on the exposed first contact layer 14. As the first electrode 15, for example, an ITO film is formed by sputtering, which is formed into a film having, for example, a thickness of 10 nm. Thereafter, it is subjected to an annealing process, for example, at 360° C. in a nitrogen ($N_2$) gas atmosphere. As a result, the ITO film maintains an amorphous state. Thus, the first electrode 15 is formed. Note that, in the annealing process of the first electrode 15, it suffices that a gas containing nitrogen ($N_2$) is used. In addition to the nitrogen ($N_2$) gas, for example, argon (Ar), helium (He), nitrogen containing them, oxygen containing nitrogen, or the like may be used.

After the first electrode 15 is formed, the protective film 31 and the passivation film 32 are formed on the first electrode 15 and the embedding layer 17 in this order. Thus, the imaging device 1 illustrated in FIG. 1 is completed.

(1-3. Operation of Imaging Device)

In the imaging device 1, when light (e.g., light having a wavelength in the visible region and the infrared region) enters the photoelectric conversion layer 13 via the passivation film 32, the protective film 31, the first electrode 15, and the first contact layer 14, this light is absorbed in the photoelectric conversion layer 13. Thus, in the photoelectric conversion layer 13, a pair of a hole and an electron is generated (photoelectric conversion is performed). At this time, for example, when a predetermined voltage is applied to the second electrode 11, a potential gradient occurs in the photoelectric conversion layer 13, and one (e.g., the hole) of the generated charges moves to the diffusion region 12A as a signal charge and is collected from the diffusion region 12A to the second electrode 11. This signal charge moves to the pixel circuit 22CA through the contact electrodes 18EA and 22EA to be read for each pixel P.

(1-4. Workings and Effects)

Recently, as a light reception device (an imaging device) of an infrared sensor, a semiconductor device using, for example, a compound semiconductor such as InGaAs for the photoelectric conversion layer has been developed. Regarding the infrared sensor, stable optical properties are required in a wavelength range of the infrared range or shorter. As one of them, it is required that an absorptance in the wavelength range of the infrared range or shorter is less than or equal to 2.5%. However, in a case where ITO is used as an electrode of the infrared sensor, the absorptance increases from about 800 nm, and a high absorptance of about 4% is exhibited for the wavelength (e.g., 1700 nm) in the near-infrared range. ITO has a low absorptance also in the infrared range and the visible range. For this reason, in a general infrared sensor, InP having a favorable absorptance in the near-infrared range is used. However, there has been an issue that the absorptance increases in the visible range.

However, in a case where the purpose is mass production, it is desirable to use ITO, which is a general transparent electrode material, for the electrode. Therefore, there is a need to develop an infrared sensor that suppresses absorption by an ITO electrode in a wavelength range of the infrared range or shorter and has excellent sensitivity to the wavelength of the infrared range or shorter.

To address this, in the imaging device 1 of the present embodiment, the first electrode 15 disposed on the light entering surface S1 side of the photoelectric converter 10S including a compound semiconductor material was formed with use of an oxide semiconductor material having an amorphous state. The first electrode 15 including the oxide semiconductor material having an amorphous state can be formed, for example, by annealing in a nitrogen ($N_2$) gas atmosphere.

FIG. 8 illustrates variation in wavelength absorption property resulting from the film thickness of the ITO film. Regarding the ITO film having a film thickness of 50 nm that has been annealed at 200° C. for 10 minutes in a nitrogen ($N_2$) atmosphere, the absorptance increased from the wavelength of 800 nm or longer. In contrast, regarding the ITO film having a film thickness of 10 nm that has been annealed at 320° C. for 5 minutes in a nitrogen (N$_2$) atmosphere, the absorptance was less than or equal to 2% also in the near-infrared range of the wavelength of 800 nm or longer. The ITO film thus exhibited a stable optical property. In addition, although not illustrated here, the ITO film that has been subjected to an annealing process in a nitrogen (N$_2$) atmosphere maintained a low resistance state.

As described above, in the present embodiment, of the first electrode 15 and the second electrode 11 opposed to each other with the photoelectric converter 10S including the compound semiconductor material therebetween, the first electrode 15 disposed on the light entering surface S1 side is formed with use of the oxide semiconductor material having an amorphous state. As a result, absorption of light including the infrared range by the first electrode 15 is reduced. Accordingly, it is possible to efficiently cause light to enter the photoelectric converter 10S, making it possible to obtain a stable optical property. Therefore, it is possible to provide the imaging device 1 having excellent sensitivity.

Moreover, in the present embodiment, it is allowed to use ITO, which is a general transparent electrode material, for the first electrode 15. Therefore, it is possible to reduce cost, making it possible to achieve mass production.

Next, a modification of the present disclosure is described. In the following, components similar to those of the embodiment described above are denoted by the same reference numerals, and a description thereof is omitted where appropriate.

2. MODIFICATION

FIG. 9 schematically illustrates a cross-sectional configuration of an imaging device (an imaging device 2) according to a modification of the present disclosure. Similarly to the imaging device 1 in the embodiment described above, the imaging device 2 is applied, for example, to an infrared sensor using a compound semiconductor material such as a Group III-V semiconductor, etc. The imaging device 2 has, for example, a photoelectric conversion function for light having a wavelength from the visible range (e.g., longer than or equal to 380 nm and shorter than 780 nm) to the near-infrared range (e.g., longer than or equal to 780 nm and shorter than 2400 nm). The imaging device 2 of the present modification differs from the embodiment described above in that a color filter (CF) layer 33 and an on-chip lens 34 are provided in this order on each pixel P disposed in the pixel region 100A on the light entering surface side, for example. The color filter layer 33 includes color filters of red (33R), green (33G), and blue (33B).

As in the present modification, also in the imaging device 2 provided with the CF 33 and the on-chip lens 34 on the light entering surface S1 side, it is possible to obtain effects similar to those in the embodiment described above.

3. APPLICATION EXAMPLES

Application Example 1

FIG. 10 illustrates a device structure and a functional configuration of the imaging device 1 (or the imaging device 2) described in the above embodiment, etc. The imaging device 1 is, for example, an infrared image sensor. The imaging device 1 includes, for example, the pixel region 100A provided in the imaging device 1, and a circuit section 130 that drives this pixel region 100A. The circuit section 130 includes, for example, a row scanner 131, a horizontal selector 133, a column scanner 134, and a system controller 132.

The pixel region 100A includes, for example, two or more pixels P (the imaging device 1) disposed two-dimensionally in a matrix. Regarding the pixels P, for example, a pixel driving line Lread (e.g., a row selection line and a reset control line) is wired for each pixel row, and a vertical signal line Lsig is wired for each pixel column. The pixel driving line Lread transmits a drive signal for reading a signal from the pixel P. One end of the pixel driving line Lread is coupled to an output end corresponding to each row of the row scanner 131.

The row scanner 131 includes a shift register, an address decoder, and the like. The row scanner 131 is a pixel drive section that drives each pixel P in the pixel region 100A, for example, on a row unit basis. A signal outputted from each pixel P of the pixel row selected and scanned by the row scanner 131 is supplied to the horizontal selector 133 through each of the vertical signal lines Lsig. The horizontal selector 133 includes an amplifier and a horizontal selection switch that are provided for each vertical signal line Lsig, etc.

The column scanner 134 includes a shift register, an address decoder, and the like. The column scanner 134 sequentially drives the horizontal selection switches of the horizontal selector 133 while scanning the respective horizontal selection switches of the horizontal selector 133. By this selective scanning by the column scanner 134, a signal of each pixel transmitted through each of the vertical signal lines Lsig is sequentially outputted to the horizontal signal line 135, and is inputted to an unillustrated signal processor or the like through the horizontal signal line 135.

As illustrated in FIG. 11, in this imaging device 1, for example, the device substrate 10 having the pixel region 100A and the circuit substrate 20 having the circuit section 130 are stacked. However, such a configuration is non-limiting. The circuit section 130 may be formed on the same substrate as that of the pixel region 100A. Alternatively, the circuit section 130 may be disposed on an external control IC. Alternatively, the circuit section 130 may be formed on another substrate coupled by a cable or the like.

The system controller 132 receives a clock supplied from the outside, data instructing an operation mode, and the like. Further, the system controller 132 outputs data such as internal information of the imaging device 1. The system controller 132 further includes a timing generator that generates various timing signals. The system controller 132 performs drive controls of the row scanner 131, the horizontal selector 133, the column scanner 134, and the like on the basis of various timing signals generated by the timing generator.

Application Example 2

The imaging device 1 described above is applicable to various types of electronic apparatuses, for example, a camera capable of imaging of an infrared range, etc. FIG. 12 illustrates a schematic configuration of the electronic apparatus 3 (a camera) as an example. This electronic apparatus 3 is, for example, a camera capable of shooting a still image or a moving image. The electronic apparatus 3 includes the imaging device 1, an optical system (an optical lens) 310, a shutter unit 311, a drive section 313, and a signal processor 312. The drive section 313 drives the imaging device 1 and the shutter unit 311.

The optical system 310 guides image light (entering light) from a subject toward the imaging device 1. This optical system 310 may include two or more optical lenses. The shutter unit 311 controls a light application period and a light blocking period for the imaging device 1. The drive section 313 controls transfer operation of the imaging device 1 and shutter operation of the shutter unit 311. The signal processor 312 performs various kinds of signal processing on a signal outputted from the imaging device 1. An image signal Dout after the signal process is stored in a storage medium such as a memory, or outputted to a monitor or the like.

Application Example 3

<Example of Application to In-Vivo Information Acquisition System>

Moreover, the technology (the present technology) according to the present disclosure is applicable to various products. For example, the technology according to the present disclosure may be applied to an endoscopic surgery system.

FIG. 13 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 13, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

A description has been given above of an example of the in-vivo information acquisition system to which the technology according to the present disclosure is applicable. The technology according to the present disclosure is applicable, for example, to the image pickup unit 10112 of the configurations described above. This improves detection accuracy.

Application Example 4

<Example of Application to Endoscopic Surgery System>

The technology (the present technology) according to the present disclosure is applicable to various products. For example, the technology according to the present disclosure may be applied to an endoscopic surgery system.

FIG. 14 is a view depicting an example of a schematic configuration of an endoscopic surgery system to which the technology according to an embodiment of the present disclosure (present technology) can be applied.

In FIG. 14, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 15 is a block diagram depicting an example of a functional configuration of the camera head 11102 and the CCU 11201 depicted in FIG. 14.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

A description has been given above of an example of the endoscopic surgery system to which the technology according to the present disclosure is applicable. The technology according to the present disclosure is applicable, for example, to the image pickup unit 11402 of the configurations described above. Application of the technology according to the present disclosure to the image pickup unit 11402 improves detection accuracy.

Note that, although the description has been given here of the endoscopic surgery system as an example, the technology according to the present disclosure may be applied to any other system such as a microscopic surgery system.

Application Example 5

<Example of Application to Mobile Body>

The technology according to the present disclosure is applicable to various products. For example, the technology according to the present disclosure may be implemented as an apparatus to be mounted on a mobile body of any kind of an automobile, an electric vehicle, a hybrid electric vehicle, a motorcycle, a bicycle, a personal mobility, an airplane, a drone, a vessel, a robot, a construction machine, an agricultural machine (tractor), etc.

FIG. 16 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 16, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 16, an audio speaker 12061, a display section 12062, and an instrument panel 12063 are illustrated as the output device. The display section 12062 may, for example, include at least one of an on-board display and a head-up display.

FIG. 17 is a diagram depicting an example of the installation position of the imaging section 12031.

In FIG. 17, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 17 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Although a description has been given above with reference to the embodiment, the modification, and the application examples, the content of the present disclosure is not limited to the embodiment, etc. described above, and various modifications are possible. For example, the layer configuration of the imaging device 1 described in the above embodiment is one example, and may further include other layers. Further, the material and the thickness of each layer are examples, and are not limited to those described above. For example, in the above embodiment, a description is given of a case where the photoelectric converter 10S includes the second contact layer 12, the photoelectric conversion layer 13, and the first contact layer 14. However, it suffices that the photoelectric converter 10S includes the photoelectric conversion layer 13. For example, the second contact layer 12 and the first contact layer 14 may not be provided. Alternatively, the photoelectric converter 10S may further include other layers.

Further, in the embodiment, etc. described above, the case where the signal charge is a hole has been described for convenience. However, the signal charge may be an electron. For example, the diffusion region may include an n-type impurity.

Moreover, the effects described in the above embodiment, etc. are examples, and may be other effects or may further include other effects.

Note that the present disclosure may have the following configurations. According to the present technology having the following configurations, of a first electrode and a second electrode that are opposed to each other with a photoelectric converter including a compound semiconductor material therebetween, the first electrode is formed using an oxide semiconductor material having an amorphous state. Accordingly, absorption of the wavelength in the infrared range or shorter by the first electrode is reduced. Therefore, it is possible to provide an imaging device having excellent sensitivity.

(1)
An imaging device including:
a first electrode that includes an oxide semiconductor material having an amorphous state;
a second electrode that is opposed to the first electrode; and
a photoelectric converter that is provided between the first electrode and the second electrode, and includes a compound semiconductor material.

(2)
The imaging device according to (1) described above, in which the oxide semiconductor material includes indium tin oxide (ITO).

(3)
The imaging device according to (1) or (2) described above, in which the first electrode is disposed on a light entering surface side of the photoelectric converter.

(4)
The imaging device according to any one of (1) to (3) described above, in which the first electrode includes a first electrode layer including the oxide semiconductor material, and a film thickness of the first electrode layer is greater than or equal to 1 nm and less than or equal to 50 nm.

(5)
The imaging device according to (4) described above, in which the first electrode further includes a second electrode layer stacked on the first electrode layer, the second electrode layer being different from the first electrode layer in material.

(6)
The imaging device according to (5) described above, in which the second electrode layer includes at least one of titanium oxide, indium oxide-zinc oxide (IZO), or IGZO.

(7)
The imaging device according to (1) to (6) described above, further including two or more pixels, in which the first electrode is provided as a common layer for the two or more pixels.

(8)
The imaging device according to (7) described above, in which the photoelectric converter includes a photoelectric conversion layer, a first contact layer, and a second contact layer, the first contact layer being provided between the photoelectric conversion layer and the first electrode, the second contact layer being provided on an opposite side of the photoelectric conversion layer from the first contact layer.

(9)
The imaging device according to (8) described above, in which the second contact layer includes a first conductivity type region and a second conductivity type region, the first conductivity type region being provided in a region that is opposed to each of the two or more pixels, the second conductivity type region being provided around the first conductivity type region.

(10)
The imaging device according to (8) or (9) described above, in which the photoelectric conversion layer absorbs at least a wavelength in an infrared range to generate a charge.

(11)
The imaging device according to any one of (8) to (10) described above, in which the photoelectric conversion layer, the first contact layer, and the second contact layer that use the photoelectric converter include a Group III-V semiconductor material.

(12)
The imaging device according to (11) described above, in which
the photoelectric conversion layer includes InGaAs, and
the first contact layer and the second contact layer include InP or InGaAs.

(13)
The imaging device according to (11) or (12) described above, in which
the first contact layer is provided on a light entering surface side of the photoelectric conversion layer, and has one conductivity type, and
the second contact layer is provided on an opposite side of the photoelectric conversion layer from a light entering surface, and has another conductivity type region in a layer of the one conductivity type for each of the pixels.

(14)
An electronic apparatus including
an imaging device including
a first electrode that includes an oxide semiconductor material having an amorphous state, a second electrode that is opposed to the first electrode, and a photoelectric converter that is provided between the first electrode and the second electrode, and includes a compound semiconductor material.

This application claims the benefit of Japanese Priority Patent Application JP2018-247892 filed with the Japan Patent Office on Dec. 28, 2018, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An imaging device, comprising:
a first electrode that includes an oxide semiconductor material having an amorphous state;
a second electrode that is opposed to the first electrode;
two or more pixels, wherein the first electrode is a common layer for the two or more pixels; and
a photoelectric converter between the first electrode and the second electrode, wherein the photoelectric converter includes:
a photoelectric conversion layer;
a first contact layer; and
a second contact layer, wherein
the first contact layer is between the photoelectric conversion layer and the first electrode,
the second contact layer is on an opposite side of the photoelectric conversion layer from the first contact layer,
the first contact layer and the photoelectric conversion layer include a compound semiconductor material,
the second contact layer includes a first conductivity type region and a second conductivity type region,
the first conductivity type region is in a region that is opposed to each pixel of the two or more pixels, and
the second conductivity type region is around the first conductivity type region.

2. The imaging device according to claim 1, wherein the oxide semiconductor material comprises indium tin oxide (ITO).

3. The imaging device according to claim 1, wherein the first electrode is on a light entering surface side of the photoelectric converter.

4. The imaging device according to claim 1, wherein
the first electrode includes a first electrode layer that includes the oxide semiconductor material, and
a film thickness of the first electrode layer is greater than or equal to 1 nm and less than or equal to 50 nm.

5. The imaging device according to claim 4, wherein
the first electrode further includes a second electrode layer stacked on the first electrode layer, and
the second electrode layer is different from the first electrode layer in material.

6. The imaging device according to claim 5, wherein the second electrode layer includes at least one of titanium oxide, indium oxide-zinc oxide (IZO), or IGZO.

7. The imaging device according to claim 1, wherein the photoelectric conversion layer is configured to:
absorb at least a wavelength in an infrared range; and
generate a charge based on the absorbed at least a wavelength.

8. The imaging device according to claim 1, wherein the photoelectric conversion layer, the first contact layer, and the second contact layer include a Group III-V semiconductor material.

9. The imaging device according to claim 8, wherein
the photoelectric conversion layer includes InGaAs, and
the first contact layer and the second contact layer include InP or InGaAs.

10. The imaging device according to claim 8, wherein
the first contact layer is on a light entering surface side of the photoelectric conversion layer,
the first contact layer has a first conductivity type, and
the second contact layer is on the opposite side of the photoelectric conversion layer from a light entering surface, and
the second contact layer has a second type region in a layer of the first conductivity type for each pixel of the two or more pixels.

11. An electronic apparatus, comprising:
an imaging device including:
a first electrode that includes an oxide semiconductor material having an amorphous state;
a second electrode that is opposed to the first electrode;
two or more pixels, wherein the first electrode is a common layer for the two or more pixels; and
a photoelectric converter between the first electrode and the second electrode, wherein the photoelectric converter includes:
a photoelectric conversion layer:
a first contact layer; and
a second contact layer, wherein
the first contact layer is between the photoelectric conversion layer and the first electrode,
the second contact layer is on an opposite side of the photoelectric conversion layer from the first contact layer,
the first contact layer and the photoelectric conversion layer include a compound semiconductor material,
the second contact layer includes a first conductivity type region and a second conductivity type region,
the first conductivity type region is in a region that is opposed to each pixel of the two or more pixels, and
the second conductivity type region is around the first conductivity type region.

* * * * *